United States Patent
Cho

(10) Patent No.: US 9,978,439 B1
(45) Date of Patent: May 22, 2018

(54) LINE DEFECT DETECTION CIRCUIT AND SEMICONDUCTOR MEMORY DEVICE INCLUDING THE SAME

(71) Applicant: SK hynix Inc., Gyeonggi-do (KR)

(72) Inventor: Yong-Deok Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/662,517

(22) Filed: Jul. 28, 2017

(30) Foreign Application Priority Data

Jan. 9, 2017 (KR) ........................ 10-2017-0002940

(51) Int. Cl.
| G11C 11/40 | (2006.01) |
| G11C 8/00 | (2006.01) |
| G11C 11/4078 | (2006.01) |
| G11C 11/4094 | (2006.01) |
| G11C 29/08 | (2006.01) |
| G11C 11/408 | (2006.01) |
| G11C 29/02 | (2006.01) |

(52) U.S. Cl.
CPC ...... *G11C 11/4078* (2013.01); *G11C 11/4087* (2013.01); *G11C 11/4094* (2013.01); *G11C 29/025* (2013.01); *G11C 29/08* (2013.01)

(58) Field of Classification Search
CPC ............ G11C 11/4078; G11C 11/4087; G11C 11/4094; G11C 29/08; G11C 29/025; G11C 29/46; G11C 29/48; G11C 29/02

USPC .......... 365/201, 185.02, 185.09, 200, 230.06
See application file for complete search history.

(56) References Cited

U.S. PATENT DOCUMENTS

| 6,529,438 B1* | 3/2003 | Suzuki | G11C 8/10 365/201 |
| 7,440,347 B1* | 10/2008 | Vogelsang | G11C 29/02 365/149 |
| 2009/0016126 A1* | 1/2009 | Teramoto | G11C 29/02 365/194 |
| 2011/0158004 A1* | 6/2011 | Tajima | G11C 29/02 365/189.04 |
| 2017/0032849 A1* | 2/2017 | Park | G11C 29/26 |

FOREIGN PATENT DOCUMENTS

KR 1020130143471 12/2013

* cited by examiner

*Primary Examiner* — Tan T. Nguyen
(74) *Attorney, Agent, or Firm* — IP & T Group LLP

(57) ABSTRACT

The semiconductor memory device includes a cell array unit comprising a plurality of cell mats; a column decoder suitable for outputting a plurality of column selection signals based on a column address to a plurality of column selection lines, respectively, during a normal operation, and for applying a signal having a first logic level to the plurality of column selection lines during a test operation; and a line defect detection circuit suitable for detecting whether a defect is present in the plurality of column selection lines in response to signals of the plurality of column selection lines, and outputting a defect detection signal based on the detection result, during the test operation.

20 Claims, 9 Drawing Sheets

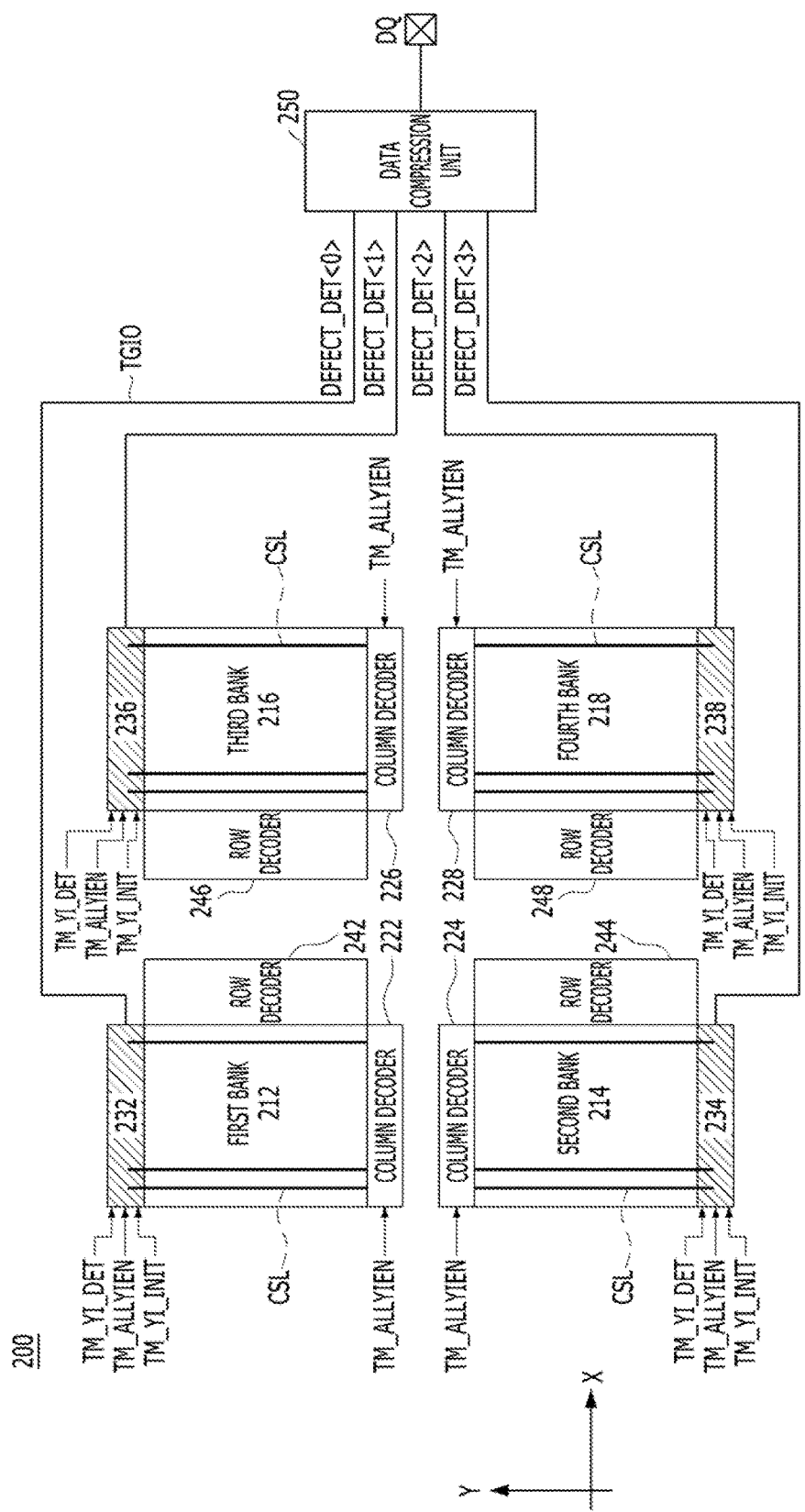

LINE DEFECT DETECTION CIRCUIT AND SEMICONDUCTOR MEMORY DEVICE INCLUDING THE SAME

CROSS-REFERENCE TO RELATED APPLICATION

The present application claims priority of Korean Patent Application No. 10-2017-0002940, filed on Jan. 9, 2017, which is incorporated herein by reference in its entirety.

BACKGROUND

1. Field

Exemplary embodiments of the present invention relate to a semiconductor design technology, and more particularly, to a semiconductor memory device capable of detecting a defect in a column selection line.

2. Description of the Related Art

A semiconductor memory device such as a double data rate synchronous dynamic random-access memory (DDRAM) may include a plurality of memory cells coupled between a plurality of word lines and a plurality of bit lines, and may use a row/column addressing scheme in order to access a specific memory cell. That is, the semiconductor memory device may receive an external address, may generate a row address and a column address, and may access a specific memory cell corresponding to the row address and the column address.

FIG. 1 is a diagram illustrating a semiconductor memory device 10. For example, FIG. 1 illustrates one word line WL among a plurality of word lines and a pair of bit lines BL and BLB among a plurality of bit lines.

Referring to FIG. 1, the semiconductor memory device 10 decodes a row address and selectively activates the word line WL. Accordingly, data stored in memory cell MC coupled to the activated word line WL is loaded onto the bit line pair BL and BLB and sensed and amplified by a bit line sense amplifier BLSA. The bit line pair BL and BLB is coupled to a local line pair LIO and LIOB, respectively, through input/output transistors IO_TR1 and IO_TR2. The input/output transistors IO_TR1 and IO_TR2 have gates coupled to a column selection line CSL and are turned on/off in response to a column selection signal Yi applied through the column selection line CSL.

The semiconductor memory device 10 decodes a column address and selectively activates any one of a plurality of column selection signals Yi. Accordingly, data is transferred between the bit line pair BL and BLB that belongs to the plurality of bit lines and onto which the data has been loaded and the local line pair O10 and LIOB corresponding to the bit line pair BL and BLB.

Accordingly, in order for the semiconductor memory device to perform a normal operation, there is a need for a circuit for detecting a defect attributable to the open or short of the column selection line CSL that transfers the column selection signal Yi.

SUMMARY

Various embodiments are directed to a line defect detection circuit capable of detecting a defect in a column selection line at a high speed in a wafer test process and a semiconductor memory device including the same.

In an embodiment, a semiconductor memory device may include a cell array unit comprising a plurality of cell mats; a column decoder suitable for outputting a plurality of column selection signals based on a column address to a plurality of column selection lines, respectively, during a normal operation, and for applying a signal having a first logic level to the plurality of column selection lines during a test operation; and a line defect detection circuit suitable for detecting whether a defect is present in the plurality of column selection lines in response to signals of the plurality of column selection lines, and outputting a defect detection signal based on the detection result, during the test operation.

In an embodiment, a semiconductor memory device may include a plurality of banks each including a plurality of cell mats; a plurality of column decoders, each suitable for being located above or below each of the banks in a column direction and for applying a signal having a first logic level to a plurality of column selection lines extended in the column direction; and a plurality of line defect detection circuits, each suitable for being located on a side opposite each of the column decoders in the column direction on each of the banks, for detecting whether a defect is present in the plurality of column selection lines based on signals of the plurality of column selection lines and for outputting a corresponding defect detection signal based on the detection result.

In an embodiment, a line defect detection circuit may include a plurality of signal lines; a line driver suitable for applying a signal having a first logic level to the plurality of signal lines; an initialization unit suitable for initializing the plurality of signal lines to a second logic level; a latch driving unit suitable for latching signals of the plurality of signal lines; a detection unit suitable for driving a sum node in response to the signals of the plurality of signal lines; and an output control unit suitable for outputting a defect detection signal corresponding to a signal of the sum node.

BRIEF DESCRIPTION OF THE DRAWINGS

FIG. 7 is a block diagram of a semiconductor memory device in accordance with an embodiment of the present invention.

DETAILED DESCRIPTION

Figure 1:
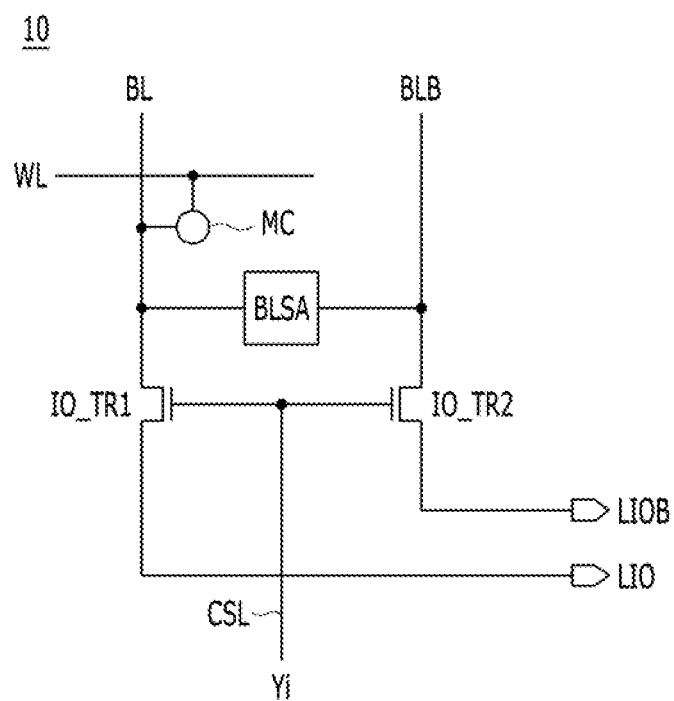
FIG. 1 is a diagram illustrating a semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Generally, during a test operation, in order to detect a column fail, a semiconductor memory device may activate a word line WL corresponding to a row address, and select one of a plurality of bit lines BL in response to a column selection signal Yi corresponding to the column address. If data read from memory cells coupled to the activated word line WL and the selected bit line BL is not data that has been originally intended, the semiconductor memory device may determine that a defect is present in a column selection line corresponding to the corresponding column address or bit lines BL. Thereafter, during a normal operation, when a column address corresponding to the column selection signal Yi of the column selection line that has been determined to have a defect is received, the semiconductor memory device may perform a column repair for selecting a redundancy column selection line instead of the corresponding column selection line. The normal operation of the semiconductor memory device may be guaranteed through such a column repair.

Figure 2:
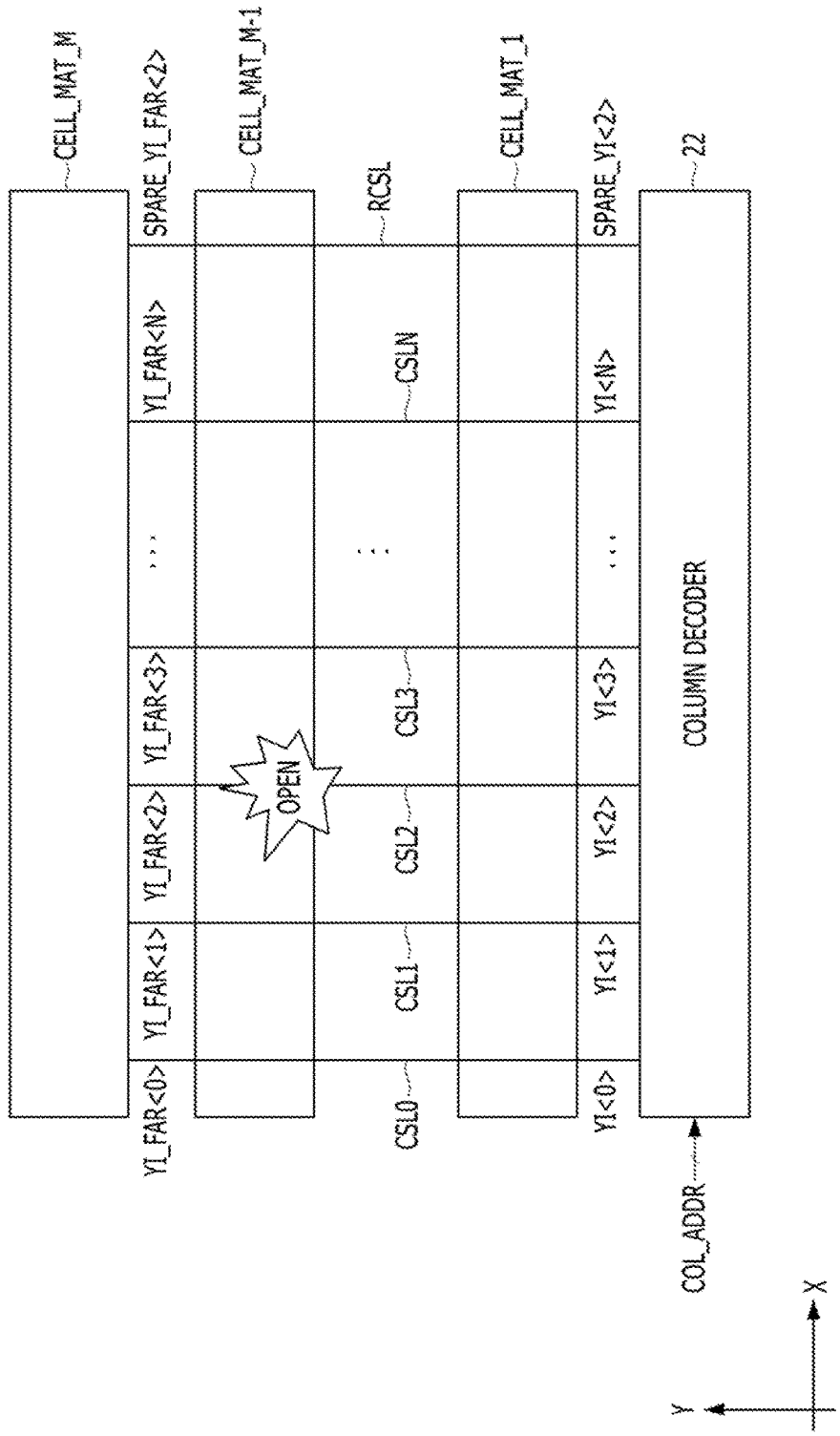
FIG. 2 is a diagram illustrating the generation of a defect in a column selection line of a semiconductor memory device.

FIG. 2 is a diagram illustrating the generation of a defect in a column selection line of a semiconductor memory device 20. For reference, FIG. 2 illustrates only a configuration related to a column operation.

Referring to FIG. 2, the semiconductor memory device 20 may include a plurality of cell mats CELL_MAT_1 to CELL_MAT_M and a column decoder 22.

The plurality of cell mats CELL_MAT_1 to CELL_MAT_M may be extended in a row direction (i.e., an X direction) and sequentially arrayed in a column direction (i.e., a Y direction). The column decoder 22 may be located below the plurality of cell mats CELL_MAT_1 to CELL_MAT_M. The column decoder 22 may decode a column address COL_ADDR and activate any one of a plurality of column selection signals YI<0:N> based on the decoded column address COL_ADDR. The plurality of column selection signals YI<0:N> may be transferred to the cell mats CELL_MAT_1 to CELL_MAT_M through corresponding column selection lines.

For reference, in FIG. 2, the reference numeral "YI<0:N>" denotes a plurality of column selection signals output to a cell mat (i.e., CELL_MAT_1) nearest to the column decoder 22. The reference numeral "YI_FAR<0:N>" denotes a plurality of column selection signals transferred to a cell mat (i.e., CELL_MAT_M) farthest from the column decoder 22. That is, if there is no skew attributable to signal transfer and there is no defect in a column selection line CSL, the column selection signal YI<0:N> and the column selection signal YI_FAR<0:N> may be activated at the same timing.

FIG. 2 shows an example in which an open is generated in a third column selection line CSL2 for transferring third column selection signals YI<2> and YI_FAR<2> due to a defect in a process and thus replaced with a redundancy column selection line RCSL for transferring redundancy column selection signals SPARE_YI<2> and SPARE_YI_FAR<2>. Hereinafter, the third column selection signals YI<2> and YI_FAR<2> are called repair target column selection signals, and the third column selection line CSL2 is hereinafter referred to as a repair target column selection line CSL2.

Figure 3A:
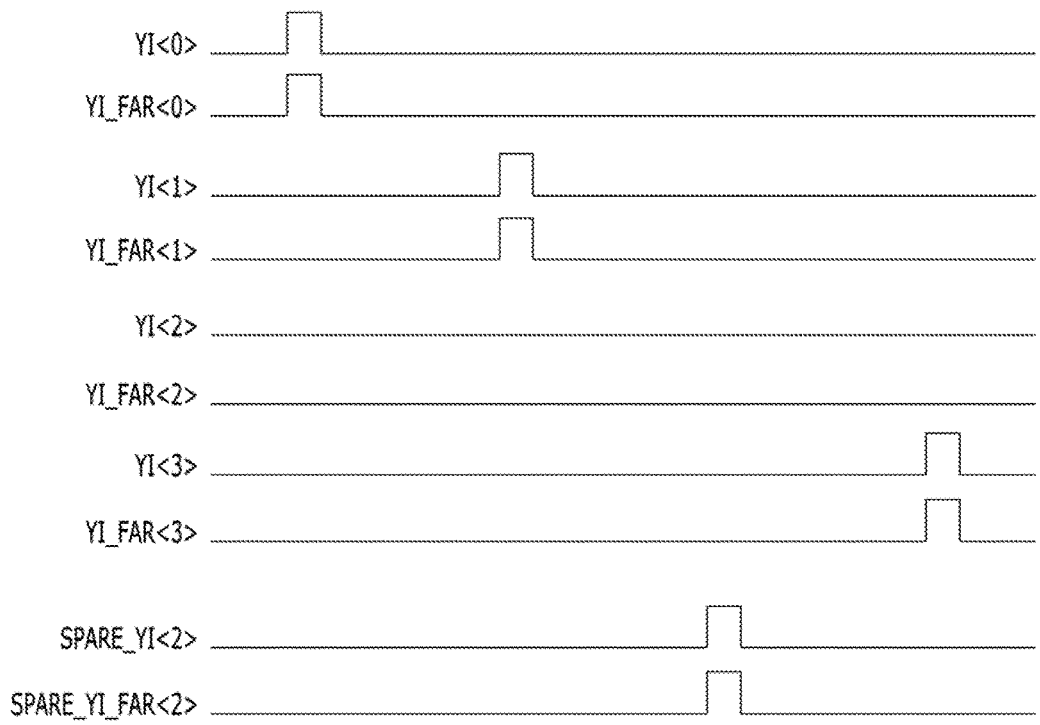
FIG. 3A is a timing diagram illustrating a case where an operation after a column repair of a semiconductor memory device is normally performed.
Figure 3B:
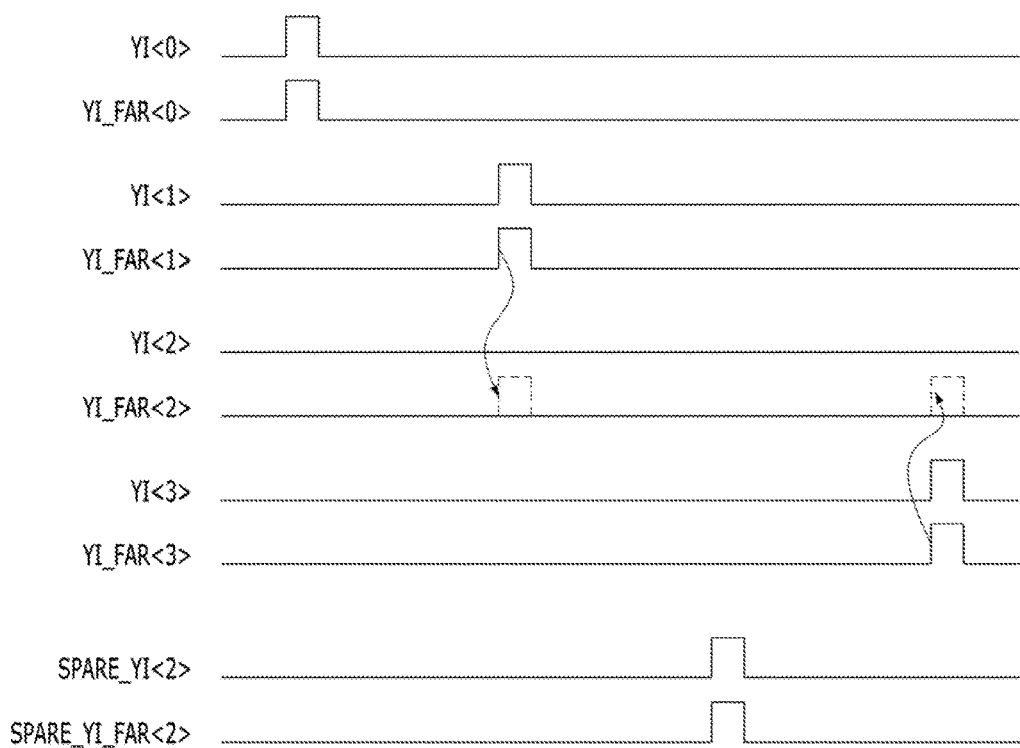
FIG. 3B is a timing diagram illustrating a case where an operation after a column repair of a semiconductor memory device is abnormally performed.

FIGS. 3A and 3B are timing diagrams illustrating a case where an operation after a column repair of a semiconductor memory device, for example, the semiconductor memory device 20 of FIG. 2 is normally performed and a case where an operation after the column repair of the semiconductor memory device 20 is abnormally performed, respectively.

Referring to FIG. 3A, if an operation after the column repair of the semiconductor memory device 20 is normally performed, when column addresses COL_ADDR corresponding to the first to the fourth column selection signals YI<0:3> and YI_FAR<0:3> are sequentially received, the first column selection signals YI<0> and YI_FAR<0>, the second column selection signals YI<1> and YI_FAR<1>, redundancy column selection signals SPARE_YI<2> and SPARE_YI_FAR<2> and the fourth column selection signals YI<3> and YI_FAR<3> may be sequentially activated. That is, since the repair target column selection line CSL2 is substituted with the redundancy column selection line RCSL, the repair target column selection signals YI<2> and YI_FAR<2> are not activated and instead the redundancy column selection signals SPARE_YI<2> and SPARE_YI_FAR<2> are activated. The repair target column selection signals YI<2> and YI_FAR<2> are deactivated.

In contrast, FIG. 3B shows a case where the repair target column selection signal YI_FAR<2> is abnormally activated due to a coupling effect generated because the repair target column selection line CSL2 is physically adjacent to surrounding column selection lines (e.g., CSL1 and CSL3).

The repair target column selection signals YI<2> and YI_FAR<2> have been separated due to the open of the repair target column selection line CSL2 (e.g., the open of FIG. 2). In this case, when the second column selection signals YI<1> and YI_FAR<1> or the fourth column selection signals YI<3> and YI_FAR<3> are activated, the repair target column selection signal YI<2> may be driven without being activated by the column driver 22. However, since the repair target column selection signal YI_FAR<2> is separated from the column decoder 22 and floated, it may be activated due to a coupling effect when the adjacent second column selection signal YI_FAR<1> or the fourth column selection signal YI_FAR<3> is activated. Accordingly, a read fail may be generated in the semiconductor memory device due to a physical collision between read data because the data is read from different memory cells at the same time due to column selection signals that are activated at the same time.

If a defect attributable to the open or short of a column selection line in a memory manufacturing process is generated as described above, the defective selection line may be repaired using a redundancy column selection line in a wafer test process. If a column selection line having a defect in a package test process is abnormally activated due to a coupling effect between the column selection line and adjacent column selection lines, however, a collision may be generated between data during a read operation, causing an operation failure in a memory device. As a result, the yield in a memory manufacturing process may be deteriorated and a memory device may come into the market without being properly screened in a test process, thereby deteriorating quality.

The present invention provides a line defect detection circuit, a semiconductor memory device employing the line detection circuit and a method thereof capable of preventing yield loss and quality deterioration which may occur in a process after a package level by detecting a defect in a selection line in a wafer test process and discarding the selection line.

Figure 4:
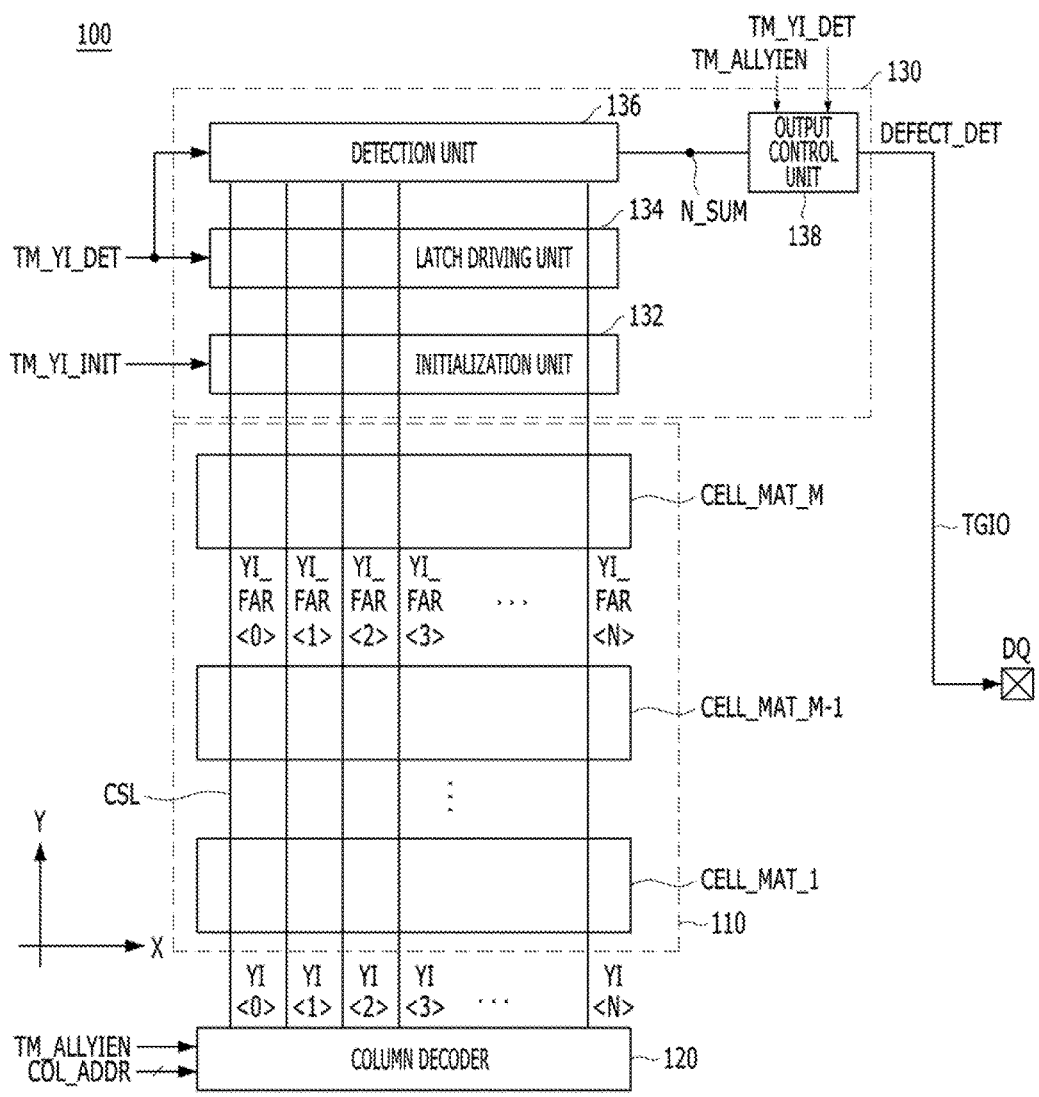
FIG. 4 is a block diagram of a semiconductor memory device in accordance with an embodiment of the present invention.

FIG. 4 is a block diagram of a semiconductor memory device 100 in accordance with an embodiment of the present invention.

Referring to FIG. 4, the semiconductor memory device 100 may include a cell array unit 110, a column decoder 120 and a line defect detection circuit 130.

The cell array unit 110 may include a plurality of cell mats CELL_MAT_1 to CELL_MAT_M extended in a row direction (i.e., an X direction) and sequentially arrayed in a column direction (i.e., a Y direction).

Upon performing a normal operation, the column decoder 120 may decode a column address COL_ADDR, generate a plurality of column selection signals YI<0:N> and YI_FAR<0:N> based on the decoded column address COL_ADDR, and output the plurality of column selection signals YI<0:N> and YI_FAR<0:N> to a plurality of column selection lines CSL. That is, during a normal operation, the column decoder 120 may generate the plurality of column selection signals YI<0:N> and YI_FAR<0:N> so that a bit line BL corresponding to the column address COL_ADDR is selected. Furthermore, during a test operation, the column decoder 120 may apply a signal having a first logic level to the plurality of column selection lines CSL in response to a detection start signal TM_ALLYIEN. In some embodiments, the first logic level may be a logic high level (i.e., a power supply voltage (VDD) level).

Upon performing a test operation, the line defect detection circuit 130 may detect whether a defect is present in the plurality of column selection lines CSL based on the signals of the plurality of column selection lines CSL, and may output a defect detection signal DEFECT_DET in response to the detection start signal TM_ALLYIEN. The line defect detection circuit 130 may output the defect detection signal DEFECT_DET through a data pad DQ. In this case, the line defect detection circuit 130 may transfer the defect detection signal DEFECT_DET to the data pad DQ through a test data input/output line TGIO provided for a high-speed parallel test.

The plurality of column selection lines CSL may be extended in the column direction. The column decoder 120 may be located at one end of the plurality of column selection lines CSL. The line defect detection circuit 130 may be located at the other end of the plurality of column selection lines CSL. That is, the column decoder 120 may be located above or below the cell array unit 110 in the column direction. The line defect detection circuit 130 may be located on the side opposite the column decoder 130 in the column direction on the basis of the cell array unit 110.

The line defect detection circuit 130 may include an initialization unit 132, a latch driving unit 134, a detection unit 136 and an output control unit 138.

The initialization unit 132 may initialize the plurality of column selection lines CSL to a second logic level in response to an initialization signal TM_YI_INIT. In some embodiments, the second logic level may be a logic low level (i.e., a ground voltage (VSS) level).

The latch driving unit 134 may latch the signals of the plurality of column selection lines CSL in response to a detection mode entry signal TM_YI_DET.

The detection unit 136 may drive a sum node N_SUM in response to the signals of the plurality of column selection lines CSL. The detection unit 136 may be enabled in response to the detection mode entry signal TM_YI_DET.

The output control unit 138 may output the defect detection signal DEFECT_DET, corresponding to a signal of the sum node N_SUM, in response to the detection start signal TM_ALLYIEN. The output control unit 138 may be enabled in response to the detection mode entry signal TM_YI_DET.

An external controller (not shown) or a test apparatus (not shown) may determine whether the corresponding semiconductor memory device 100 may be used or discarded based on the defect detection signal DEFECT_DET output through the data pad DQ.

As described above, in one embodiment of the present invention, the column decoder 130 is disposed at one end of the plurality of column selection lines CSL, and the line defect detection circuit 130 is disposed at the other end of the plurality of column selection lines CSL. Upon performing a test operation, when the column decoder 130 applies a signal having a specific level to the plurality of column selection lines CSL, the line defect detection circuit 130 located on the other side may read the signals of the plurality of column selection lines CSL and detect whether a defect is present in the plurality of column selection lines CSL based on the read signals. That is, in a wafer test process, a defect can be detected in a defective selection line in a short time, and whether to use or discard a corresponding semiconductor memory device can be determined based on a result of the detection. Accordingly, yield loss and quality deterioration in a process after a package level can be prevented.

A detailed configuration of the line defect detection circuit 130 in accordance with an embodiment of the present invention is described below with reference to FIG. 5.

Figure 5:
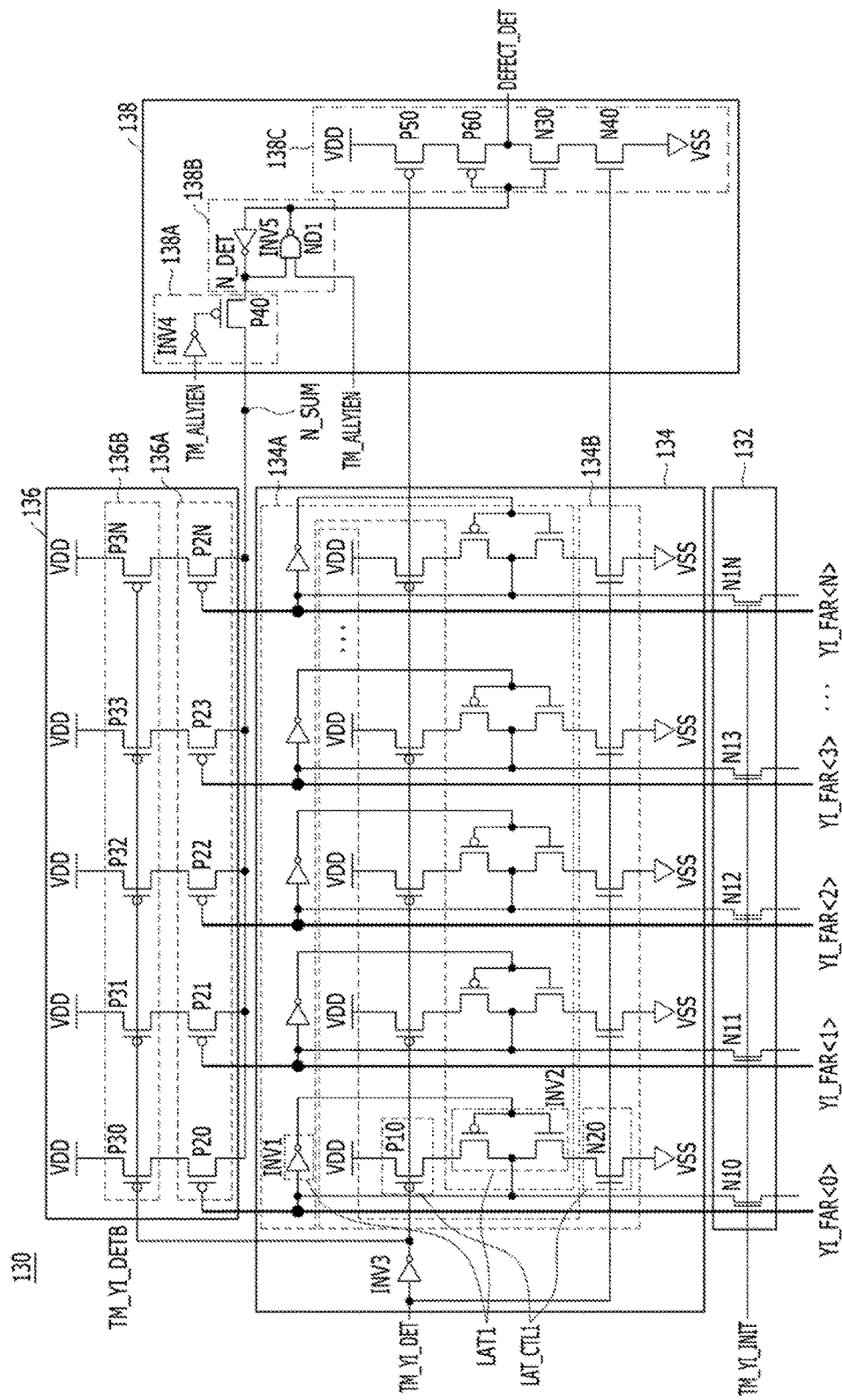
FIG. 5 is a circuit diagram of a line defect detection circuit in accordance with an embodiment of the present invention.

FIG. 5 is a circuit diagram of a line defect detection circuit in accordance with an embodiment of the present invention, for example, the line defect detection circuit 130 of FIG. 4.

Referring to FIG. 5, the line defect detection circuit 130 may include the initialization unit 132, the latch driving unit 134, the detection unit 136 and the output control unit 138.

The initialization unit 132 may include a plurality of first NMOS transistors N10 to N1N configured to correspond to the plurality of column selection lines CSL, respectively, coupled between the plurality of column selection lines CSL and a ground voltage (VSS) stage and turned on in response to the initialization signal TM_YI_INIT. Accordingly, the initialization unit 132 may initialize the plurality of column selection lines CSL to a logic low level (i.e., a ground voltage (VSS) level) in response to the initialization signal TM_YI_INIT.

The latch driving unit 134 may include a first latch unit 134A and a latch control unit 134B. The first latch unit 134A is configured to latch the signals of the plurality of column selection lines CSL. The latch control unit 134B is configured to enable the first latch unit 134A in response to the detection mode entry signal TM_YI_DET.

The first latch unit 134A may include a plurality of latches LAT1 configured to correspond to the plurality of column selection lines CSL, respectively. Each of the plurality of latches LAT1 may include a first inverter INV1 and a second inverter INV2. The first inverter INV1 is configured to have an input stage coupled to each of the column selection lines CSL. The second inverter INV2 is configured to have an input stage coupled to the output stage of the first inverter INV1 and to have an output stage coupled to each of the column selection lines CSL.

The latch control unit 134B may include a plurality of unit control units LAT_CTL1 configured to correspond to the plurality of latches LAT1, respectively, and to supply driving voltages to the latches LAT1, respectively, in response to the detection mode entry signal TM_YI_DET. For example, if the second inverter INV2 includes a PMOS transistor and an NMOS transistor coupled in series, each of the plurality of unit control units LAT_CTL1 may include a first PMOS transistor P10 and a second NMOS transistor N20. The first PMOS transistor P10 is coupled between a power supply voltage (VDD) stage and the PMOS transistor of each of the second inverters INV2 and is turned on in response to an inverted detection mode entry signal TM_YI_DETB. The second NMOS transistor N20 is coupled between the ground voltage (VSS) stage and the NMOS transistor of each of the second inverters INV2 and is turned on in response to the detection mode entry signal TM_YI_DET.

Accordingly, each of the plurality of latches LAT1 of the latch driving unit 134 may latch the signal of each of the column selection lines CSL when the detection mode entry signal TM_YI_DET is activated. In some embodiments, the latch driving unit 134 may further include an inverter INV3 configured to generate the inverted detection mode entry signal TM_YI_DETB by inverting the detection mode entry signal TM_YI_DET.

The detection unit 136 may include a driving unit 136A and a detection control unit 136B. The driving unit 136A is configured to drive the sum node N_SUM in response to the signals of the plurality of column selection lines CSL. The detection control unit 136B is configured to enable the driving unit 136A based on the detection mode entry signal TM_YI_DET.

The driving unit 136A may include a plurality of second PMOS transistors P20 to P2N configured to correspond to the plurality of column selection lines CSL, respectively. The detection control unit 136B may include a plurality of third PMOS transistors P30 to P3N configured to correspond to the plurality of column selection lines CSL, respectively. The plurality of second PMOS transistors P20 to P2N may be coupled between one ends of the plurality of third PMOS transistors P30 to P3N and the sum node N_SUM and may be turned on in response to the signals of the plurality of column selection lines CSL. The plurality of third PMOS transistors P30 to P3N may have the other ends coupled to the power supply voltage (VDD) stage and may be turned on in response to the inverted detection mode entry signal TM_YI_DETB. Accordingly, when the detection mode entry signal TM_YI_DET is activated, the detection control unit 136B may supply the power supply voltage (VDD) to the driving unit 136A, and the driving unit 136A may drive the sum node N_SUM in response to the signals of the column selection lines CSL.

The output control unit 138 may include a coupling unit 138A, a second latch unit 138B and an output driver 138C.

The coupling unit 138A may couple the sum node N_SUM and a detection node N_DET based on the detection start signal TM_ALLYIEN. When the detection start signal TM_ALLYIEN is activated, the coupling unit 138A may couple the sum node N_SUM and the detection node N_DET. For example, the coupling unit 138A may include a fourth inverter INV4 configured to invert the detection start signal TM_ALLYIEN and a fourth PMOS transistor P40 coupled between the sum node N_SUM and the detection node N_DET and turned on in response to output of the fourth inverter INV4 (I.e., the inverted detection start signal).

The second latch unit 138B may initialize the detection node N_DET when the detection start signal TM_ALLYIEN is deactivated, and may latch the signal of the detection node N_DET when the detection start signal TM_ALLYIEN is activated. The second latch unit 138B may perform an inverting latch operation. For example, the second latch unit 138B may include a NAND gate ND1 and a fifth inverter INV5. The NAND gate ND1 is configured to receive the signal of the detection node N_DET and the detection start signal TM_ALLYIEN and to perform a NAND operation. The fifth inverter INV5 is configured to have an input stage coupled to the output stage of the NAND gate ND1 and to have an output stage coupled to the detection node N_DET.

The output driver 138C may be enabled in response to the detection mode entry signal TM_YI_DET and may output the output of the second latch unit 138B as the defect detection signal DEFECT_DET. For example, the output driver 138C may include a fifth PMOS transistor P50, a sixth PMOS transistor P60, a third NMOS transistor N30 and a fourth NMOS transistor N40. The fifth PMOS transistor P50 is configured to have one end coupled to the power supply voltage (VDD) stage and is turned on in response to the inverted detection mode entry signal TM_YI_DETB. The sixth PMOS transistor P60 is coupled between the other end of the fifth PMOS transistor P50 and an output node and is turned on in response to the output of the second latch unit 138B. The third NMOS transistor N30 is configured to have one end coupled to the output node and is turned on in response to the output of the second latch unit 138B. The fourth NMOS transistor N40 is coupled between the other end of the third NMOS transistor N30 and the ground voltage (VSS) stage and is turned on in response to the detection mode entry signal TM_YI_DET. Accordingly, when the detection mode entry signal TM_YI_DET is activated, the output driver 138C may be enabled, may invert the output of the second latch unit 138B, and may output the inverted output of the second latch unit 138B as the defect detection signal DEFECT_DET.

An operation of the line defect detection circuit 130 in accordance with an embodiment of the present invention is described below with reference to FIG. 6.

Figure 6A:
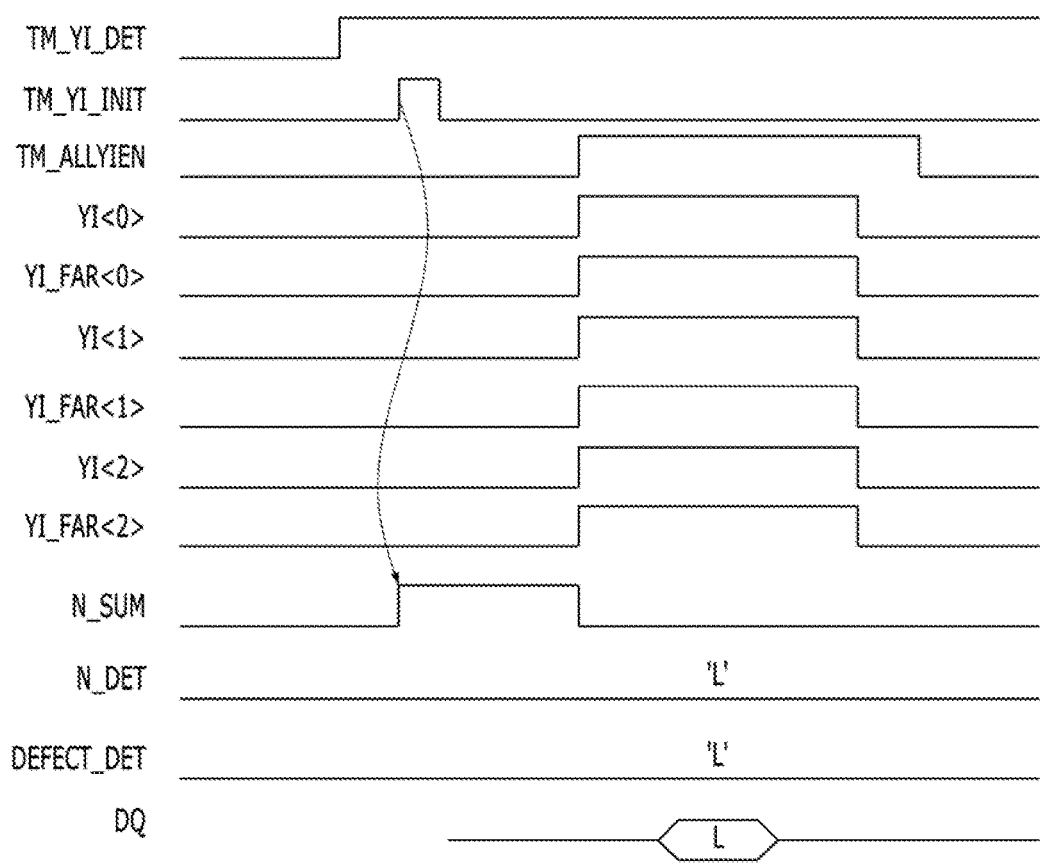
FIGS. 6A and 6B are timing diagrams illustrating operations of a line defect detection circuit in accordance with an embodiment of the present invention.
Figure 6B:
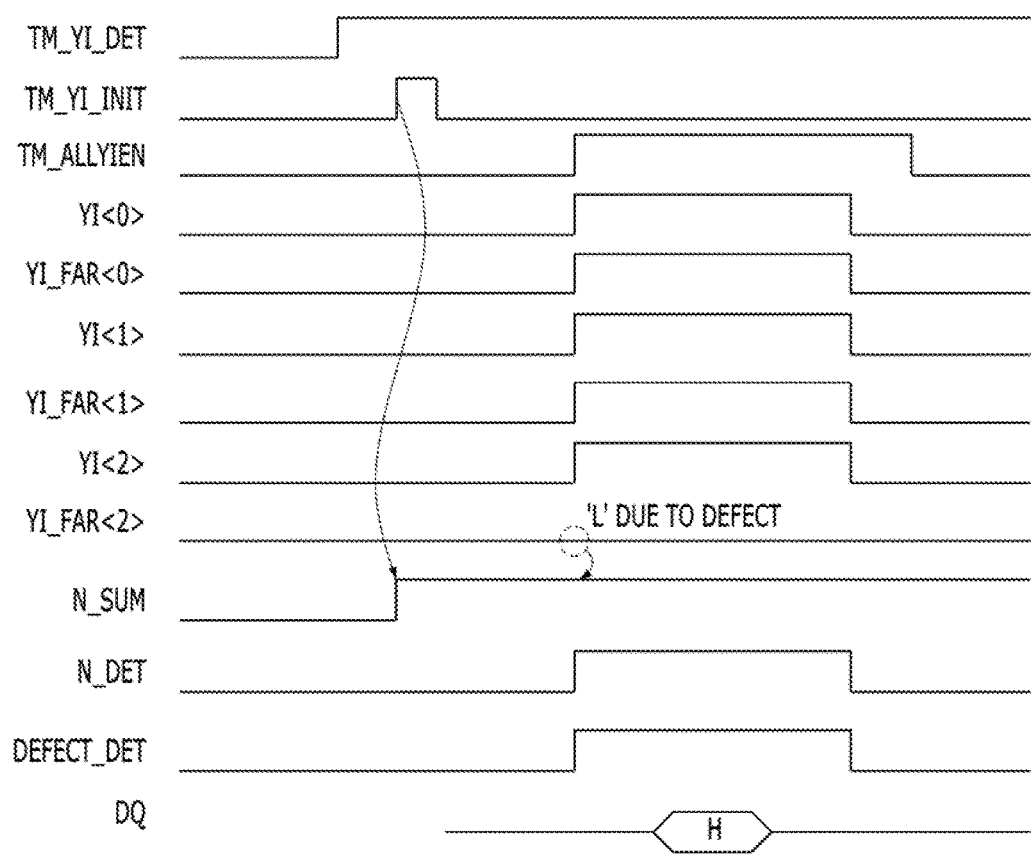

FIGS. 6A and 6B are timing diagrams illustrating operations of a line defect detection circuit in accordance with an embodiment of the present invention, for example, operations of the line defect detection circuit 130 of FIG. 5.

FIG. 6A illustrates an operation of the line defect detection circuit 130 shown in FIG. 5 when there is no defect in a column selection line CSL.

First, when the detection mode entry signal TM_YI_DET is activated, the latch driving unit 134, the detection unit 136 and the output driver 138C of the output control unit 138 are enabled.

Next, when the initialization signal TM_YI_INIT is activated, the initialization unit 132 may initialize the plurality of column selection lines CSL to the ground voltage (VSS) level.

Accordingly, the latch driving unit 134 may latch the signals of the plurality of column selection lines CSL, and the detection unit 136 may drive the sum node N_SUM in response to the signals of the plurality of column selection lines CSL. At this time, the detection unit 136 may drive the sum node N_SUM to the power supply voltage (VDD) level because all of the signals of the plurality of column selection lines CSL have the ground voltage (VSS) level. The detection node N_DET has been initialized to a logic low level by the second latch unit 138B of the output control unit 138 because the detection start signal TM_ALLYIEN has been deactivated.

Next, when the detection start signal TM_ALLYIEN is activated, the column decoder 120 may apply a signal having a logic high level to the plurality of column selection lines CSL. That is, the column decoder 120 may output the plurality of column selection signals YI<0:N> and YI_FAR<0:N> so that they have a logic high level. At this time, if there is no skew attributable to signal transfer and all of the plurality of column selection lines CSL do not have a defect, the column selection signal YI<0:N> output to a cell mat (i.e., CELL_MAT_1) nearest to the column decoder 120 and the plurality of column selection signals YI_FAR<0:N> transferred to a cell mat (I.e., CELL_MAT_M) farthest from the column decoder 120 may be activated at the same timing. Accordingly, the column selection signal YI_FAR<0:N> shifts to a logic high level, and thus all of the plurality of second PMOS transistors P20 to P2N included in the driving unit 136A of the detection unit 136 are turned off. As a result, the sum node N_SUM maintains a high impedance (HIGH-Z) state.

At this time, the coupling unit 138A of the output control unit 138 couples the sum node N_SUM and the detection node N_DET in response to the activated detection start signal TM_ALLYIEN. Accordingly, the signal of the detection node N_DET having a logic low level "L" is transferred to the sum node N_SUM, so the sum node N_SUM is driven to a logic low level. The second latch unit 138B of the output control unit 138 may latch the signal of the detection node N_DET in response to the activated detection start signal TM_ALLYIEN, and the output driver 138C may output the output (i.e., the latched signal of the detection node N_DET) of the second latch unit 138B as the defect detection signal DEFECT_DET.

Accordingly, the defect detection signal DEFECT_DET having a logic low level "L" may be finally output through the data pad DQ. An external controller (not shown) or a test apparatus (not shown) may determine whether or not to use the corresponding semiconductor memory device 100 based on the defect detection signal DEFECT_DET output through the data pad DQ.

FIG. 6B illustrates an operation of the line defect detection circuit 130 shown in FIG. 5 when a defect is generated in the repair target column selection line CSL2 due to an open.

First, when the detection mode entry signal TM_YI_DET is activated, the latch driving unit 134, the detection unit 136 and the output driver 138C of the output control unit 138 are enabled.

Next, when the initialization signal TM_YI_INIT is activated, the initialization unit 132 may initialize the plurality of column selection lines CSL to the ground voltage (VSS) level. At this time, the initialization unit 132 may initialize the plurality of column selection lines CSL to the ground voltage (VSS) level regardless of a defect in the column selection lines CSL because the initialization unit 132 is located at the end of the plurality of column selection lines CSL.

Accordingly, the latch driving unit 134 may latch the signals of the plurality of column selection lines CSL, and the detection unit 136 may drive the sum node N_SUM to the power supply voltage (VDD) level in response to the signals of the plurality of column selection lines CSL. At this time, the detection node N_DET has been initialized to a logic low level by the second latch unit 138B of the output control unit 138 because the detection start signal TM_AL-LYIEN has been deactivated.

Next, when the detection start signal TM_ALLYIEN is activated, the column decoder 120 may apply a signal having a logic high level to the plurality of column selection lines CSL. At this time, if a defect has occurred in the repair target column selection line CSL2 due to an open, the repair target column selection signal YI<2> output to a cell mat (i.e., CELL_MAT_1) closest to the column decoder 122 is output with a logic high level. In contrast, the repair target column selection signal YI_FAR<2> transferred to a cell mat (i.e., CELL_MAT_M) farthest from the column decoder 120 maintains an initialization level, that is, a logic low level.

Accordingly, the sum node N_SUM maintains the power supply voltage (VDD) level because the second PMOS transistor P22 that belongs to the driving unit 136A of the detection unit 136 and that corresponds to the repair target column selection signal YI_FAR<2> maintains a turn-on state.

The signal of the sum node N_SUM having the power supply voltage (VDD) level is transferred to the detection node N_DET because the coupling unit 138A of the output control unit 138 couples the sum node N_SUM and the detection node N_DET in response to the activated detection start signal TM_ALLYIEN. The second latch unit 138B may latch the signal of the detection node N_DET in response to the activated detection start signal TM_ALLYIEN, and the output driver 138C may output the output of the second latch unit 138B (i.e., the latched signal of the detection node N_DET) as the defect detection signal DEFECT_DET.

Accordingly, the defect detection signal DEFECT_DET having a logic high level "H" may be finally output through the data pad DQ. An external controller (not shown) or a test apparatus (not shown) may determine whether or not to discard the corresponding semiconductor memory device 100 based on the defect detection signal DEFECT_DET output through the data pad DQ.

FIG. 7 is a block diagram of a semiconductor memory device 200 in accordance with an embodiment of the present invention.

For reference, FIG. 7 illustrates a configuration for detecting a defect in a plurality of column selection lines CSL. A column address, a row address, a bank active signal, etc. which are related to a normal operation have been omitted. An example in which the semiconductor memory device 200 includes four banks is described for convenience sake of description.

Referring to FIG. 7, the semiconductor memory device 200 may include a plurality of banks 212 to 218 each including a plurality of cell mats (not shown), a plurality of column decoders 222 to 228 and a plurality of line defect detection circuits 232 to 238.

The plurality of column decoders 222 to 228 may be located above or below the respective banks in a column direction (i.e., a Y direction). Each of the plurality of column decoders 222 to 228 may apply a signal having a first logic level to the plurality of column selection lines CSL extended in the column direction in response to a detection start signal TM_ALLYIEN. Each of the column decoders 222 to 228 of FIG. 7 may correspond to the column decoder 120 of FIG. 4.

The plurality of line defect detection circuits 232 to 238 may be located on the side opposite the respective column decoders 222 to 228 in the column direction on the basis of the respective banks. The plurality of line defect detection circuits 232 to 238 may detect whether a defect is present in the plurality of column selection lines CSL based on the signals of the plurality of column selection lines CSL, and may output respective defect detection signals DEFECT_DET<0:3> to a data pad DQ in response to the detection start signal TM_ALLYIEN.

Upon performing a test operation, each of the line defect detection circuits 232 to 238 may initialize a plurality of the column selection lines CSL to a second logic level in response to an initialization signal TM_YI_INIT, and may latch the signals of the plurality of column selection lines CSL in response to a detection mode entry signal TM_YI_DET. Furthermore, when the detection start signal TM_ALLYIEN is activated, each of the line defect detection circuits 232 to 238 may detect whether a defect is present in the plurality of column selection lines CSL in response to signals applied to the plurality of column selection lines CSL, and may output each of the defect detection signals DEFECT_DET<0:3>. At this time, each of the line defect detection circuits 232 to 238 may output each of the defect detection signals DEFECT_DET<0:3> to the data pad DQ through respective test data input/output lines TGIO provided for a high-speed parallel test as shown in FIG. 4. Each of the line defect detection circuits 232 to 238 of FIG. 7 may correspond to the line defect detection circuit 130 of FIG. 4, and thus a detailed description thereof is omitted.

The semiconductor memory device 200 may further include a plurality of row decoders 242 to 248 located on one side of the respective banks 212 to 218 in a row direction and a data compression unit 250 configured to compress the defect detection signals DEFECT_DET<0:3> output by the plurality of line defect detection circuits 232 to 238 and to output the compressed signal to the data pad DQ.

An external controller (not shown) or a test apparatus (not shown) may determine whether to use or discard the corresponding semiconductor memory device 200 based on compressed data output through the data pad DQ.

As described above, in one embodiment of the present invention, the line defect detection circuits 232 to 238 are disposed so that they are located on the side opposite the column decoders 222 to 228 in the column direction on the basis of the respective banks 212 to 218. Upon performing a test operation, when the column decoders 222 to 228 apply a signal having a specific level to the plurality of column selection lines CSL, the line defect detection circuits 232 to 238 may read the signals of the plurality of column selection lines CSL and detect whether a defect is present in the plurality of column selection lines CSL based on the read signals.

Accordingly, in a wafer test process, a defect in a defective selection line can be detected in a short time. Also, whether to use or discard a corresponding semiconductor memory device can be determined based on whether or not a defect is detected. Accordingly, yield loss and quality deterioration in a process after a package level can be prevented.

In the above embodiment, the semiconductor memory device has been illustrated, but the present invention is not limited thereto. For example, an embodiment of the present invention may be implemented using a line defect detection circuit configured to include a plurality of metal lines, a line driver located at one end of the plurality of metal lines and a defect detection unit located at the other end of the plurality of metal lines. In this case, the defect detection unit may include an initialization unit configured to initialize a plurality of signal lines to a second logic level in response to an initialization signal, a latch driving unit enabled in response to a detection mode entry signal and configured to latch the signals of the plurality of signal lines, a detection unit configured to latch a sum node in response to the signals of the plurality of signal lines, and an output control unit configured to output a defect detection signal corresponding to a signal of the sum node in response to a detection start signal.

For example, the location and type of logic gates and transistors illustrated in the aforementioned embodiments may be differently implemented depending on the polarity of an input signal.

The semiconductor memory device in accordance with the proposed embodiment can detect a defect in a column selection line in a short time in a wafer test process.

Furthermore, the semiconductor memory device in accordance with an embodiment can prevent yield loss and quality deterioration in a process after a package level by discarding a chip detected to have a defect in a column selection line in a wafer test process.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
    a cell array unit comprising a plurality of cell mats;
    a column decoder which outputs a plurality of column selection signals being used in the plurality of cell mats of the cell array unit based on a column address to a plurality of column selection lines, respectively, during a normal operation, and applies a signal having a first logic level to the plurality of column selection lines during a test operation; and
    a line defect detection circuit which detects whether a defect is present in the plurality of column selection lines in response to signals of the plurality of column selection lines, and outputting a defect detection signal based on the detection result, during the test operation.

2. The semiconductor memory device of claim 1, wherein each of the column selection lines is extended in a column direction, and has a first end coupled to the column decoder and a second end coupled to the line defect detection circuit.

3. The semiconductor memory device of claim 1, wherein the line defect detection circuit outputs the defect detection signal through a data pad.

4. The semiconductor memory device of claim 1, wherein the line defect detection circuit comprises:
    an initialization unit which initializes the plurality of column selection lines to a second logic level in response to an initialization signal;
    a latch driving unit which latches the signals of the plurality of column selection lines in response to a detection mode entry signal;
    a detection unit which drives a sum node in response to the signals of the plurality of column selection lines; and
    an output control unit which outputs the defect detection signal corresponding to a signal of the sum node in response to a detection start signal.

5. The semiconductor memory device of claim 4, wherein the latch driving unit comprises:
    a first latch unit which latches the signals of the plurality of column selection lines; and
    a latch control unit which enables the first latch unit in response to the detection mode entry signal.

6. The semiconductor memory device of claim 4, wherein the detection unit comprises:
    a driving unit which drives the sum node in response to the signals of the plurality of column selection lines; and
    a detection control unit which enables the driving unit in response to the detection mode entry signal.

7. The semiconductor memory device of claim 4, wherein the output control unit comprises:
- a coupling unit which couples the sum node and a detection node in response to the detection start signal;
- a second latch unit which initializes the detection node when the detection start signal is deactivated and latches a signal of the detection node when the detection start signal is activated; and
- an output driver which is enabled in response to the detection mode entry signal and outputs output of the second latch unit as the defect detection signal.

8. A semiconductor memory device comprising:
- a plurality of banks each including a plurality of cell mats;
- a plurality of column decoders, being used in the plurality of cell mats of the plurality of banks, each located above or below each of the banks in a column direction and applies a signal having a first logic level to a plurality of column selection lines extended in the column direction; and
- a plurality of line defect detection circuits, each located on a side opposite each of the column decoders in the column direction on each of the banks, which detects whether a defect is present in the plurality of column selection lines based on signals of the plurality of column selection lines and outputs a corresponding defect detection signal based on the detection result.

9. The semiconductor memory device of claim 8, further comprising:
- a plurality of row decoders each located on one side of each of the banks in a row direction; and
- a data compression unit which compresses defect detection signals output by the plurality of line defect detection circuits and outputs the compressed defect detection signal to a data pad.

10. The semiconductor memory device of claim 8, wherein the line defect detection circuit comprises:
- an initialization unit which initializes the plurality of column selection lines to a second logic level in response to an initialization signal;
- a latch driving unit which latches the signals of the plurality of column selection lines in response to a detection mode entry signal;
- a detection unit which drives a sum node in response to the signals of the plurality of column selection lines; and
- an output control unit which outputs the defect detection signal corresponding to a signal of the sum node in response to a detection start signal.

11. The semiconductor memory device of claim 10, wherein the latch driving unit comprises:
- a first latch unit which latches the signal of the plurality of column selection lines; and
- a latch control unit which enables the first latch unit in response to the detection mode entry signal.

12. The semiconductor memory device of claim 10, wherein the detection unit comprises:
- a driving unit which drives the sum node in response to the signal of the plurality of column selection lines; and
- a detection control unit which enables the driving unit in response to the detection mode entry signal.

13. The semiconductor memory device of claim 10, wherein the output control unit comprises:
- a coupling unit which couples the sum node and a detection node in response to the detection start signal;
- a second latch unit which initializes the detection node when the detection start signal is deactivated and latches a signal of the detection node when the detection start signal is activated; and
- an output driver which is enabled in response to the detection mode entry signal and outputs output of the second latch unit as the defect detection signal.

14. A line defect detection circuit comprising:
- a plurality of signal lines;
- a line driver which applies a signal having a first logic level to the plurality of signal lines;
- an initialization unit which initializes the plurality of signal lines to a second logic level;
- a latch driving unit which latches signals of the plurality of signal lines;
- a detection unit which drives a sum node in response to the signals of the plurality of signal lines; and
- an output control unit which outputs a defect detection signal corresponding to a signal of the sum node.

15. The line defect detection circuit of claim 14, wherein:
the line driver is located at a first end of the plurality of signal lines, and
the initialization unit, the latch driving unit, the detection unit and the output control unit are located at a second end of the plurality of signal lines.

16. The line defect detection circuit of claim 14, wherein the initialization unit comprises:
- a plurality of first transistors which corresponds to the plurality of signal lines, respectively, is coupled between the plurality of signal lines and a ground voltage stage and is turned on in response to an initialization signal.

17. The line defect detection circuit of claim 14, wherein the latch driving unit comprises:
- a latch unit including a plurality of latches corresponding to the plurality of signal lines, respectively, and latches the signals of the plurality of signal lines, respectively; and
- a latch control unit comprising a plurality of unit control units corresponding to the plurality of latches, respectively, and enables the respective latches in response to a detection mode entry signal.

18. The line defect detection circuit of claim 14, wherein the detection unit comprises:
- a driving unit including a plurality of second transistors corresponding to the plurality of signal lines, respectively, and drives the sum node in response to the signals of the plurality of signal lines; and
- a detection control unit including a plurality of third transistors corresponding to the plurality of second transistors, respectively, and supplies a power supply voltage to the respective second transistors in response to a detection mode entry signal.

19. The line defect detection circuit of claim 14, wherein the output control unit comprises:
- a coupling unit which couples the sum node and a detection node in response to a detection start signal;
- a second latch unit which initializes the detection node when the detection start signal is deactivated and latches a signal of the detection node when the detection start signal is activated; and
- an output driver which is enabled in response to a detection mode entry signal and outputs output of the second latch unit as the defect detection signal.

20. The line defect detection circuit of claim 19, wherein the second latch unit comprises:
- a logic gate which receives the signal of the detection node and the detection start signal and performs a NAND operation; and an inverter having an input stage coupled to an output stage of the logic gate and having an output stage coupled to the detection node.

* * * * *